United States Patent
Gupta et al.

(10) Patent No.: US 9,292,372 B2
(45) Date of Patent: Mar. 22, 2016

(54) ERROR PAD FOR SAFETY DEVICE

(71) Applicants: Chandan Gupta, New Delhi (IN); Neha Bagri, Aligarh (IN); Ray C. Marshall, Harpenden (GB)

(72) Inventors: Chandan Gupta, New Delhi (IN); Neha Bagri, Aligarh (IN); Ray C. Marshall, Harpenden (GB)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 195 days.

(21) Appl. No.: 14/280,652

(22) Filed: May 18, 2014

(65) Prior Publication Data

US 2015/0331740 A1    Nov. 19, 2015

(51) Int. Cl.
 *G06F 11/00* (2006.01)
 *G06F 11/07* (2006.01)
 *G06F 17/50* (2006.01)
 *H03K 19/173* (2006.01)

(52) U.S. Cl.
 CPC ........ *G06F 11/0772* (2013.01); *G06F 11/0751* (2013.01); *G06F 17/5045* (2013.01); *H03K 19/1737* (2013.01)

(58) Field of Classification Search
 CPC ............ G06F 11/0751; G06F 11/0772; G06F 11/0748; G06F 11/0793; G06F 17/5045; G06F 17/5054; G06F 9/468; H03K 19/1737; G01S 19/37
 See application file for complete search history.

(56) References Cited

U.S. PATENT DOCUMENTS

| | | | | |
|---|---|---|---|---|
| 4,656,592 A | * | 4/1987 | Spaanenburg | ...... G06F 17/5045 716/125 |
| 5,594,367 A | * | 1/1997 | Trimberger | .... H03K 19/017581 326/38 |
| 6,285,211 B1 | * | 9/2001 | Sample | ............ H03K 19/17744 326/39 |
| 6,496,880 B1 | | 12/2002 | Ma | |
| 6,856,173 B1 | | 2/2005 | Chun | |
| 7,199,607 B2 | * | 4/2007 | Volkening | .......... H03K 19/1732 326/104 |
| 8,332,795 B2 | | 12/2012 | Chen | |
| 8,365,123 B2 | | 1/2013 | Chen | |
| 8,386,980 B2 | | 2/2013 | Murray | |
| 2007/0220191 A1 | * | 9/2007 | Gupta | ............ H03K 19/017581 710/110 |
| 2014/0365814 A1 | * | 12/2014 | Chillie | ...................... H04L 1/00 714/5.1 |

FOREIGN PATENT DOCUMENTS

WO    WO 2014203028 A1 *  12/2014  .............. G06F 11/30

* cited by examiner

*Primary Examiner* — Bryce Bonzo
*Assistant Examiner* — Anthony J Amoroso
(74) *Attorney, Agent, or Firm* — Charles E. Bergere

(57) ABSTRACT

A safety device with an error indication function includes at least one ERROR pad configured between the error indication function and at least one normal function, and a set of multiplexers connected to the ERROR pad. The safety device further includes an error indication block and a functional block multiplexed by the set of multiplexers. The error indication block includes a fault collection and control unit for collecting and providing error occurrence information to the ERROR pad, and an ERROR pad select control register for storing ERROR pad selection and configuration information to control select inputs of the first set of multiplexers and provide the ERROR pad configuration information to the ERROR pad.

15 Claims, 3 Drawing Sheets

ERROR PAD FOR SAFETY DEVICE

BACKGROUND OF THE INVENTION

The present invention relates to integrated circuits used in safety applications and, more particularly, to an ERROR pad for an integrated circuit used in safety applications.

Safety compliant auto devices have a pad to indicate the occurrence of an internal error. FIG. 1 shows a conventional ERROR pad connection in an integrated circuit of a safety device 100 with an ERROR pad 102 dedicated for safety applications. A fault collection and control unit 104 is connected to a data pin 106 of the ERROR pad 102 for collecting and providing error occurrence information to the ERROR pad 102. A plurality of configuration pins 108 of the ERROR pad 102 are tied to predetermined static values, e.g. "0" or "1", so that the error occurrence information input through the data pin 106 can be output through an output pin 110 of the ERROR pad 102. For safety reasons, none of the configuration pins 108 may be configurable via a memory mapped register, therefore the ERROR pad 102 cannot be multiplexed with other functions. This requirement limits safety devices that cannot afford a dedicated ERROR pad or more than one ERROR pad in a pad limited System-on-Chip (SoC) design. Further, the number of pads that can be used for functional pad multiplexing is also limited by this requirement especially in a safety device with a lower pin count package.

It is desirable that the ERROR pad be available for functional pad multiplexing when not being used as an ERROR pad.

BRIEF DESCRIPTION OF THE DRAWINGS

The invention, together with objects and advantages thereof, may best be understood by reference to the following description of preferred embodiments together with the accompanying drawings in which.

DETAILED DESCRIPTION OF PREFERRED EMBODIMENTS

Figure 1:
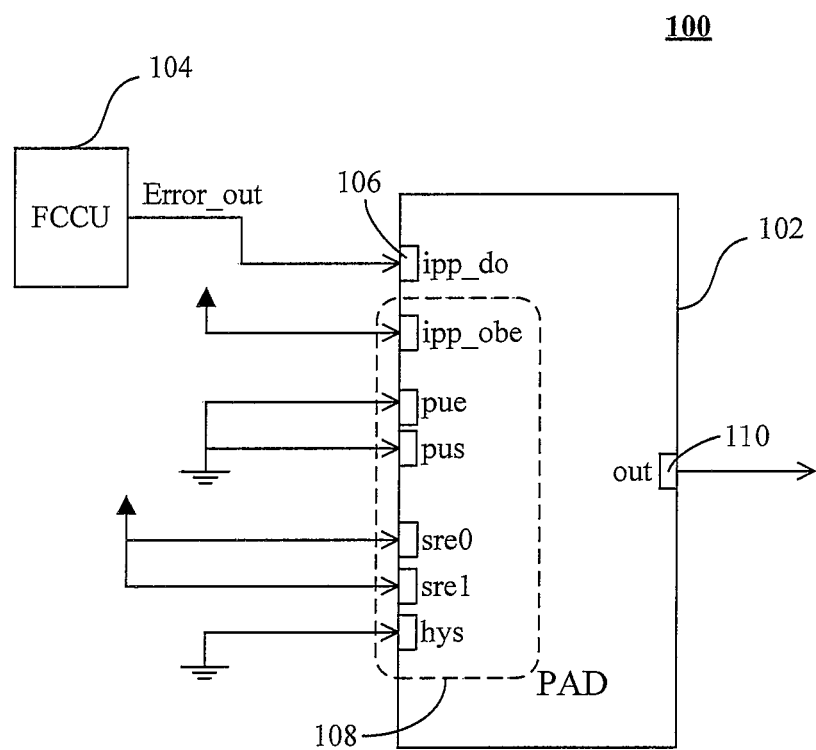
FIG. 1 is a schematic block diagram of a conventional ERROR pad connection in an integrated circuit.

The detailed description set forth below in connection with the appended drawings is intended as a description of presently preferred embodiments of the invention, and is not intended to represent the only forms in which the present invention may be practised. It is to be understood that the same or equivalent functions may be accomplished by different embodiments that are intended to be encompassed within the spirit and scope of the invention. In the drawings, like numerals are used to indicate like elements throughout. Furthermore, the terms "comprises," "comprising," or any other variation thereof, are intended to cover a non-exclusive inclusion, such that module, circuit, device components, structures and method steps that have a list of elements or steps does not include only those elements but may include other elements or steps not expressly listed or inherent to such module, circuit, device components or steps. An element or step proceeded by "comprises . . . a" does not, without more constraints, preclude the existence of additional identical elements or steps that comprises the element or step.

In one embodiment, the present invention provides a safety device with an error indication function. The safety device includes at least one ERROR pad configured between the error indication function and at least one normal function, a first set of multiplexers connected to the ERROR pad, and an error indication block connected to a first set of inputs of the first set of multiplexers for performing the error indication function. The error indication block includes a fault collection and control unit for collecting and providing error occurrence information within the safety device to the ERROR pad, and an ERROR pad select control register for storing ERROR pad selection and configuration information to control select inputs of the first set of multiplexers and provide the ERROR pad configuration information to the ERROR pad. The safety device further includes a functional block connected to a second set of inputs of the first set of multiplexers for performing the at least one normal function.

Figure 2:
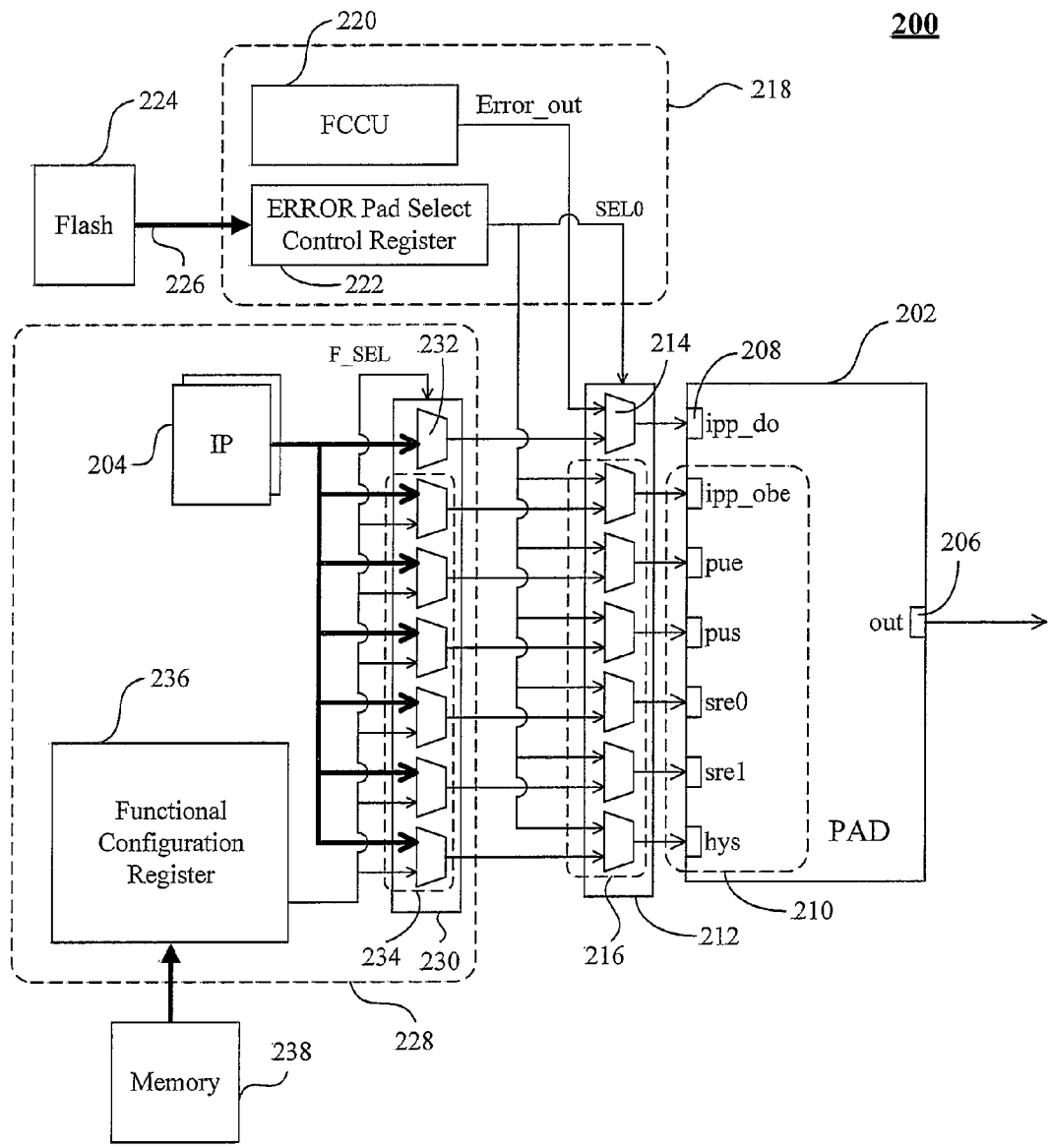
FIG. 2 is a schematic block diagram of an ERROR pad connection in an integrated circuit in accordance with an embodiment of the present invention.

Referring now to FIG. 2, a schematic block diagram of an ERROR pad connection in an integrated circuit of a safety device 200 with an error indication function in accordance with an embodiment of the present invention is shown. The safety device 200 includes at least one ERROR pad 202 configured between the error indication function and at least one normal function performed by at least one functional module 204, e.g., an intellectual property (IP) in a SOC. The ERROR pad 202 has a plurality of input pins and an output pin 206, where the plurality input pins include a data pin ipp_do 208 for receiving data to be output through the output pin 206, and a plurality of configuration pins 210 for configuring the ERROR pad 202 according to different functions. In a preferred embodiment, the plurality of configuration pins 210 include an output buffer enable pin ipp_obe, a pull enable pin pue, a pull select pin pus for configuring the ERROR pad 202 between pull-up and pull-down, two slew rate enable pins sre0 and sre1, and a hysteresis control pin hys. A first set of multiplexers 212 are connected to the input pins of the ERROR pad 202. The first set of multiplexers 212 include a first data multiplexer 214 connected to the data pin 208 of the ERROR pad 202, and a plurality of first configuration multiplexers 216, wherein each of the plurality of first configuration multiplexers 216 is connected to one of the configuration pins 210 of the ERROR pad 202.

The safety device 200 also includes an error indication block 218 connected to a first set of inputs of the first set of multiplexers 212 for performing the error indication function. The error indication block 218 includes a fault collection and control unit (FCCU) 220 for collecting and providing error occurrence information within the safety device 200 to the ERROR pad 202, and an ERROR pad select control register 222 for storing ERROR pad selection and configuration information to control select inputs of the first set of multiplexers 212 and provide the ERROR pad configuration information to the ERROR pad 202. For example, the ERROR pad select control register 222 contains 32 bits, and is configured as TABLE 1 shown as below, wherein BITS 0-3 are configured for ERROR pad select and BITS 16-19 and 28-29 are configured for controlling the plurality of configuration pins of the ERROR pad 202.

TABLE 1

| | |
|---|---|
| BIT 0 | SEL0—1$^{st}$ ERROR pad select |
| BIT 1 | SEL1—2$^{nd}$ ERROR pad select |
| BIT 2 | SEL2—3$^{rd}$ ERROR pad select |
| BIT 3 | SEL3—4$^{th}$ ERROR pad select |

TABLE 1-continued

| BIT 16 | PUE—weak pull enable |
| BIT 17 | PUS—weak pull select |
| BIT 18 | HYS—hysteresis enable |
| BIT 19 | OBE—output buffer enable |
| BIT 28 | SRE[0]—slew rate control[0] |
| BIT 29 | SRE[1]—slew rate control[1] |
| BITS 4-15, 20-27 and 30-31 | Reserved |

However, the plurality of configuration pins 210 of the ERROR pad 202 and the BITS in the ERROR pad select control register 222 are not limited to the pins and BITs mentioned above, and can be related to any pad characteristic configuration that can be controlled via the ERROR pad select control register 222.

In a preferred embodiment, the safety device 200 includes a first memory 224 for loading the ERROR pad selection and configuration information to the ERROR pad select control register 222. In a preferred embodiment, the first memory 224 is a flash memory and connected to the ERROR pad select control register 222 through a write data path 226, wherein the write data path 226 is only activated during a reset phase of the safety device 200. Therefore, after data of the ERROR pad select control register 222 is loaded from the first memory 224, the ERROR pad select control register 222 is latched and cannot be changed thereafter.

The safety device 200 further includes a functional block 228 connected to a second set of inputs of the first set of multiplexers 212 for performing the at least one normal function. In a preferred embodiment, the functional block 228 includes a second set of multiplexers 230 connected to the first set of multiplexers 212, wherein the second set of multiplexers 230 includes a second data multiplexer 232 connected to the first data multiplexer 214 and a plurality of second configuration multiplexers 234, wherein each of the plurality of second configuration multiplexers 234 is connected to one of the plurality of first configuration multiplexers 216. The functional block 228 further includes the at least one functional module 204, e.g. an IP, connected to the second set of multiplexers 230 for providing the at least one normal function. The functional module 204 provides a functional output to the second data multiplexer 232.

The functional block 228 also includes a functional configuration register 236 connected to the second set of multiplexers 230 for storing functional selection information F_SEL to control select inputs of the second set of multiplexers 230. For example, when there is more than one functional module 204 multiplexed by the second set of multiplexers 230, the functional selection information F_SEL selects the input of the second data multiplexer 232. In a preferred embodiment, the functional configuration register 236 further stores and provides functional configuration information to the ERROR pad 202 by way of the second configuration multiplexers 234. In another preferred embodiment, the functional module 204 provides the functional configuration information to the ERROR pad 202 by way of the second configuration multiplexers 234. Inputs of the second configuration multiplexers 234 are also selected by the functional selection information F_SEL. For example, the functional configuration register 236 contains 32 bits, and is configured as TABLE 2 shown as below, wherein BITS 0-3 are configured for functional selection information and BITS 16-19 and 28-29 are configured for providing the functional configuration information to the plurality of configuration pins of the ERROR pad 202.

TABLE 2

| BIT 0-3 | F_SEL—functional selection information |
| BIT 16 | PUE—weak pull enable |
| BIT 17 | PUS—weak pull select |
| BIT 18 | HYS—hysteresis enable |
| BIT 19 | OBE—output buffer enable |
| BIT 28 | SRE[0]—slew rate control[0] |
| BIT 29 | SRE[1]—slew rate control[1] |
| BITS 4-15, 20-27 and 30-31 | Reserved |

However, the BITS in the functional configuration register 236 are not limited to the BITS mentioned in TABLE 2, and can be related to any pad characteristic configuration that can be controlled via the functional configuration register 236.

In a preferred embodiment, the safety device 200 includes a second memory 238 for storing and loading the functional selection and configuration information to the functional configuration register 236. The functional configuration register 236 is a software programmable register. The second memory 238 can be a RAM or part of an internal memory (RAM) of a micro control unit (MCU) of the safety device 200. Therefore, when the ERROR pad 202 is not used for the error indication function, the ERROR pad 202 can be used for other various functions.

Figure 3:
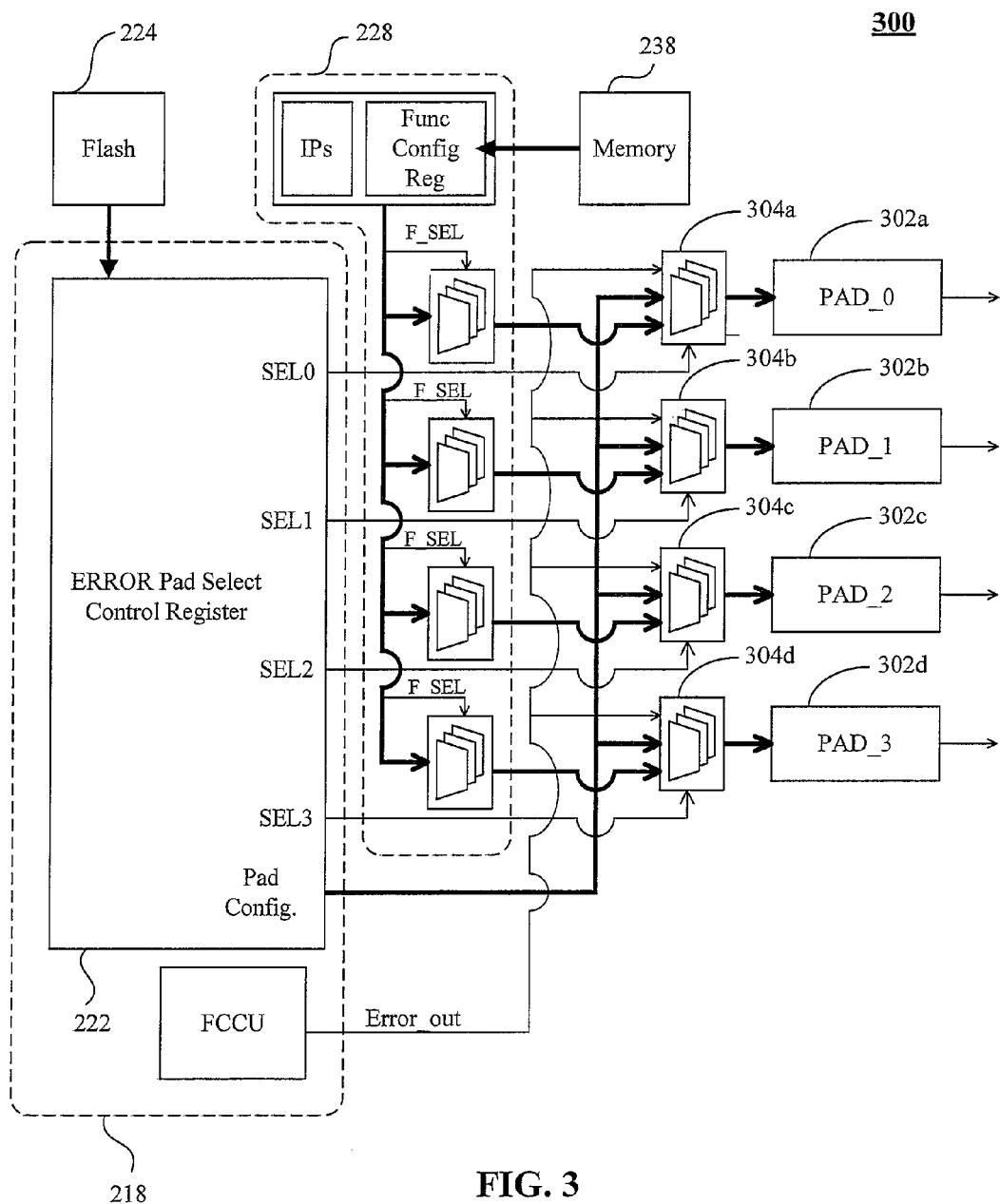
FIG. 3 is a schematic block diagram of an ERROR pad connection in an integrated circuit in accordance with another embodiment of the present invention.

Referring to FIG. 3, a schematic block diagram of an ERROR pad connection in an integrated circuit of a safety device 300 in accordance with another embodiment of the present invention is shown. The safety device 300 includes four sets of ERROR pad connection as shown in FIG. 2 with four ERROR pads 302a-302d. Each of the ERROR pads 302a-302d is connected to one of first sets of multiplexers 304a-304d, and each of the first sets of multiplexers 304a-304d is controlled by one of selection bits SEL0-SEL 3 in the ERROR pad select control register 222. Both of the error indication block 218 and the functional block are connected to and multiplexed by the first sets of multiplexers 304a-304d to provide configuration information to the ERROR pads 302a-302d. Therefore, flexible options are provided to select an ERROR pad for the error indication function.

The description of the preferred embodiments of the present invention has been presented for purposes of illustration and description, but is not intended to be exhaustive or to limit the invention to the forms disclosed. It will be appreciated by those skilled in the art that changes could be made to the embodiments described above without departing from the broad inventive concept thereof. It is understood, therefore, that this invention is not limited to the particular embodiment disclosed, but covers modifications within the spirit and scope of the present invention as defined by the appended claims.

The invention claimed is:

1. A safety device with an error indication function, comprising:
    an ERROR pad configured between the error indication function and at least one normal function;
    a first set of multiplexers connected to the ERROR pad;
    an error indication block connected to a first set of inputs of the first set of multiplexers for performing the error indication function, wherein the error indication block comprises:
        a fault collection and control unit for collecting and providing error occurrence information within the safety device to the ERROR pad, and
        an ERROR pad select control register for storing ERROR pad selection and configuration information that is used to control select inputs of the first set of multiplexers and provide the ERROR pad configuration information to the ERROR pad; and a functional block connected to a second set of inputs of the first set of multiplexers for performing the at least one normal function.

2. The safety device of claim 1, wherein the ERROR pad comprises a plurality of input pins and an output pin, wherein the plurality input pins include:

a data pin for receiving data to be output through the output pin, and a plurality of configuration pins for configuring the ERROR pad for different functions.

3. The safety device of claim 2, wherein the configuration pins include an output buffer enable pin, a pull enable pin, a pull select pin, two slew rate enable pins, and a hysteresis control pin.

4. The safety device of claim 2, wherein the first set of multiplexers comprises:

a first data multiplexer connected to the data pin; and a plurality of first configuration multiplexers, wherein each of the first configuration multiplexers is connected to one of the configuration pins.

5. The safety device of claim 4, wherein the fault collection and control unit provides the error occurrence information to the ERROR pad by way of the first data multiplexer.

6. The safety device of claim 4, wherein the error pad select control register provides error pad configuration information to the ERROR pad by way of the first configuration multiplexers.

7. The safety device of claim 1, further comprising a first memory for loading the error pad selection and configuration information into the error pad select control register when the safety device is under reset.

8. The safety device of claim 7, wherein the first memory is a flash memory.

9. The safety device of claim 1, wherein the functional block comprises:

a second set of multiplexers connected to the first set of multiplexers;

at least one functional module connected to the second set of multiplexers for providing the at least one normal function; and a functional configuration register connected to the second set of multiplexers for storing functional selection information to control select inputs of the second set of multiplexers.

10. The safety device of claim 9, wherein the second set of multiplexers comprises:

a second data multiplexer connected to the first data multiplexer; and a plurality of second configuration multiplexers, wherein each of the second configuration multiplexers is connected to one of the plurality of first configuration multiplexers.

11. The safety device of claim 10, wherein the functional module provides a functional output to the second data multiplexer.

12. The safety device of claim 10, wherein the functional configuration register further stores and provides functional configuration information to the ERROR pad by way of the second configuration multiplexers.

13. The safety device of claim 10, wherein the functional module provides the functional configuration information to the ERROR pad by way of the second configuration multiplexers.

14. The safety device of claim 9, further comprising a second memory for loading the functional selection and configuration information into the functional configuration register.

15. The safety device of claim 14, wherein the functional configuration register is a software programmable register.

* * * * *